United States Patent [19]
Saito et al.

[11] Patent Number: 5,991,164
[45] Date of Patent: Nov. 23, 1999

[54] ELECTRONIC DEVICE WITH CONNECTING/DISCONNECTING SCREW

[75] Inventors: Tatsuo Saito; Tomoki Ikeda; Kouta Iijima, all of Fukushima-ken, Japan

[73] Assignee: Alps Electric Co., Ltd., Japan

[21] Appl. No.: 09/049,961

[22] Filed: Mar. 27, 1998

[30] Foreign Application Priority Data

Mar. 27, 1997 [JP] Japan ................................ 9-076059

[51] Int. Cl.⁶ .................................................. H05K 7/14
[52] U.S. Cl. ........................ 361/799; 361/752; 361/753; 361/759; 174/51
[58] Field of Search ................................ 361/752, 799, 361/800, 816, 818, 753, 759; 174/35 R, 35 GC, 51

[56] References Cited

U.S. PATENT DOCUMENTS

| | | |
|---|---|---|
| 3,895,267 | 7/1975 | Gordon et al. ................. 361/753 X |
| 5,107,404 | 4/1992 | Tam ................................... 361/818 |
| 5,414,223 | 5/1995 | Suski et al. ................... 361/753 X |
| 5,420,378 | 5/1995 | Estes et al. ................... 361/753 X |
| 5,446,617 | 8/1995 | Blocher et al. ............... 361/799 X |
| 5,500,789 | 3/1996 | Miller et al. ..................... 361/816 |
| 5,519,169 | 5/1996 | Garrett et al. ................... 174/35 R |
| 5,608,611 | 3/1997 | Szudarek et al. .................. 361/753 |

FOREIGN PATENT DOCUMENTS 8153986   6/1996   Japan .

*Primary Examiner*—Jayprakash Gandhi
*Attorney, Agent, or Firm*—Brinks Hofer Gilson & Lione

[57] ABSTRACT

The electronic device of the present invention comprises a chassis, a printed circuit board mounted to the chassis and having circuit patterns formed thereon and a protective element connected onto the circuit patterns which protective element is for attenuating a surge voltage, and screws for holding the printed circuit board on the chassis, wherein the protective element is connected to the chassis through any of the screws.

3 Claims, 5 Drawing Sheets

ELECTRONIC DEVICE WITH CONNECTING/DISCONNECTING SCREW

BACKGROUND OF THE INVENTION

1. Field of the Invention

The present invention relates to an electronic device which constitutes a power supply circuit such as, for example, a head end as a transmitter in a transmission base of a CATV (cable television) system.

2. Description of the Prior Art

In a CATV system, using an ordinary ground wave, a television signal or a satellite broadcasting signal is transmitted to each subscriber of the CATV through a dedicated cable. Then, a head end receives such television signal or satellite broadcasting signal, converts the frequency thereof into a frequency of an intermediate frequency band, and sends out the thus frequency-converted signal again after frequency conversion to the frequency of a channel allocated to the CATV system.

FIG. 7 is a power supply circuit diagram of an electronic device used in such a conventional head end or the like. As shown in the same figure, a power supply block 30 comprises electric components such as a transformer and an electrolytic capacitor (neither shown). A so-called commercial voltage (for example, an AC voltage of 100V or 240V) is fed to an input terminal 31. The thus-inputted commercial voltage is converted to a predetermined DC voltage (for example, a DC voltage of +5V or +9V) by the power-supply block 30 and this converted voltage is fed to an output terminal 32. This output DC voltage serves to drive a frequency converter (not shown), etc.

To the input terminal 31 are connected two protective elements 33, 33 in series between power supply lines to protect the power supply block 30 from a surge voltage such as a thunder voltage for example. A connection point 33a between the protective elements 33, 33 is earthed. By this earthing, (i.e. grounding) when a high voltage such as a thunder voltage is applied induced in the power supply lines, it is bypassed to the earth through the protective elements 33, whereby the power supply block 30 is protected from the high voltage.

However, as to the power supply circuit in the electronic device referred to above, it is prescribed that the power supply circuit should be subjected to a high withstand voltage test in which a high voltage (for example, an AC voltage of 2400V) similar to such a surge voltage as a thunder voltage should be applied as a test voltage to the power supply circuit (according to a safety standard such as UL Standard established by Underwriting Laboratory).

FIG. 8 is an explanatory diagram of the power supply circuit to be subjected to such a high withstand voltage test. As shown in the same figure, one end portion of a switch element 34 is connected to the connection point 33a between the protective elements 33, 33, that is, arresters in the power supply circuit, while the opposite end portion of the switch element 34 is earthed.

To the input terminal 31 is connected a high voltage generator 35.

In this high withstand voltage test, a high voltage (for example an AC voltage of 2400V) generated from the high voltage generator 35 is applied one to two seconds to the input terminal 31 while the switch element 34 is kept OFF, and it is tested whether the power supply block 30 can withstand this high voltage.

This high voltage withstand test is conducted only once in the power supply circuit manufacturing process prior to shipment of product (electronic device). After the test, the switch element 34 is turned ON, and during shipment of the product, the connection point 33a between the protective elements 33, 33 is earthed (ON of the switch element 34).

FIG. 9 is a sectional view of a principal portion of a conventional electronic device C. A chassis 20 is in the shape of a rectangular box formed of a metallic material. The box-shaped chassis 20 comprises four side walls 20a, a lower bottom wall 26b and an upper opening portion 20c. A plurality of cylindrical holding members 21 formed of a metallic material are each centrally provided with a hole 21a and are secured to the bottom wall 26b.

A printed circuit board 22 formed of, for example, a resin material or a molding material has circular holes 22e in a plurality of predetermined positions, for example, in the four corners. On the upper surface of the printed circuit board 22 are formed desired circuit patterns, including earth patterns 22d, with use of copper foil for example. At predetermined positions of the circuit patterns 22a are arranged and connected electric components of a power supply block 30, such as a power transformer 22c, as well as an electrolytic capacitor and a diode (neither shown).

Also disposed and connected is a protective element 22b such as an arrester to protect the power supply block from a surge voltage.

One terminal 22f of the protective element 22b is connected to an earth pattern 22d.

Thus, on the printed circuit board 22 are arranged and connected the protective element 22b and electric components, including the power transformer 22c, which constitute such a power supply circuit as shown in FIG. 7.

Screws 23 are used, which are round head or pan head machine screws formed of a metallic material. The printed circuit board 22 is disposed within the chassis 20, and the screws 23 are threaded and fixed into the holes 22e of the printed circuit board 22 located on the holding members 21.

The earth pattern located at one end portion of the printed circuit board 22 and the associated side wall 20a of the chassis 20 are connected together with solder 25. By this connection with solder 25 one terminal 22f of the protective element 22b such as an arrester is earthed to the chassis 20.

Between the earth pattern 22d with one terminal 22f of the protective element 22b connected thereto and the chassis 20 there is constituted the switch element 34 shown in FIG. 8. The state of connection with solder 25 and that of non-connection (separation) correspond respectively to ON and OFF states of the switch element 34 in the foregoing high withstand voltage test.

An upper cover 24, which is formed by a metallic plate, comprises a rectangular upper wall 24a and a plurality of resilient mounting portions 24b bent from end portions of four sides of the upper wall 24a and extending downward.

The upper cover 24 is mounted in such a manner that its upper wall 24a covers the upper opening portion 20c of the chassis 20 and its mounting portions 24b grip the side walls 20a of the chassis.

The following description is now provided about a high withstand voltage test for the electronic device C constructed as above.

First, the printed circuit board 22 is screwed into the chassis 20. At this time, soldering for connecting an earth pattern 22d on the board 22 to the side wall 20a of the chassis 20 is not performed at the solder 25, and one terminal 22f of the protective element 22b is not earthed to the chassis 20, that is, the switch element 34 is turned OFF.

Next, the upper cover 24 is applied to the chassis 20 in the same form as that of a completed product.

In this form, a high voltage is applied from the high voltage generator 35 to the input terminal 31 of the power supply circuit shown in FIG. 8 and which constitutes the electronic device C, and there is conducted a high withstand voltage test for the power supply block 30. That is, during this application of the high voltage, the power supply block 30 is not protected from a surge voltage by the protective element 22b.

Then, the upper cover 24 of the electronic device C having gone through the process of the above high withstand voltage test is removed and the earth pattern 22d on the printed circuit board 22 and the side wall 20a of the chassis 20 are soldered using the solder 25, that is, the switch element 34 is turned ON. As a result of this soldering, one terminal 22f of the protective element 22b is electrically connected to the chassis 20, and the protective element 22b comes to exhibit the function of protecting the power supply block 30.

The power supply block 30 can now be protected from a surge voltage by the protective element 22b.

Next, the upper cover 24 is applied to the chassis 20 to complete the electronic device C having undergone the high withstand voltage test.

However, in the high withstand voltage test for the conventional electronic device during assembly thereof, as mentioned above, with the earth-side terminal of the protective element such as an arrester not soldered (earthed) to the chassis, the upper cover is applied to the chassis and a high voltage is applied to the electronic device. Then, the upper cover of the electronic device after the test in question is removed and the earth pattern with the earth-side terminal of the protective element connected thereto is soldered (earthed) to the chassis.

Thus, for the conventional electronic device, the high withstand voltage test is conducted with the upper cover applied to the chassis, thereafter, the upper cover is removed and the soldering work for earthing the protecting element is performed, and after the soldering work, the upper cover is again applied to the chassis. This process is complicated and troublesome, making the working efficiency poor.

SUMMARY OF THE INVENTION

According to the present invention, in one aspect thereof, there is provided an electronic device comprising a metallic chassis, a printed circuit board mounted to the chassis, circuit patterns formed on the printed circuit board, a protective element connected to the circuit patterns for attenuating a surge voltage, and screws for holding the printed circuit board on the chassis, the circuit patterns and the chassis being connected together electrically through the screws.

According to the present invention, in another aspect thereof, there is provided an electronic device comprising a metallic chassis, a printed circuit board mounted to the chassis, circuit patterns and a lead-out pattern which are formed on the printed circuit board, a protective element connected to the circuit patterns for attenuating a surge voltage, holding screws for holding the printed circuit board to the chassis, and a connecting/disconnecting screw for connection and disconnection between the circuit patterns and the lead-out pattern, the circuit patterns and the lead-out pattern being connected together electrically through the connecting/disconnecting screw, and the lead-out pattern and the chassis being electrically connected together through any of the holding screws.

In the electronic device according to the present invention, the chassis has an opening portion, which is covered with an upper cover. The upper cover has holes formed in positions opposed to the aforesaid screws, and cylindrical sleeves are respectively fitted in the holes so as to surround the screws.

The electronic device according to the present invention is constructed so that the sleeves can be snapped in the holes of the upper cover.

DETAILED DESCRIPTION OF PREFERRED EMBODIMENTS

Embodiments of the present invention will be described in detail hereinafter.

Figure 7:
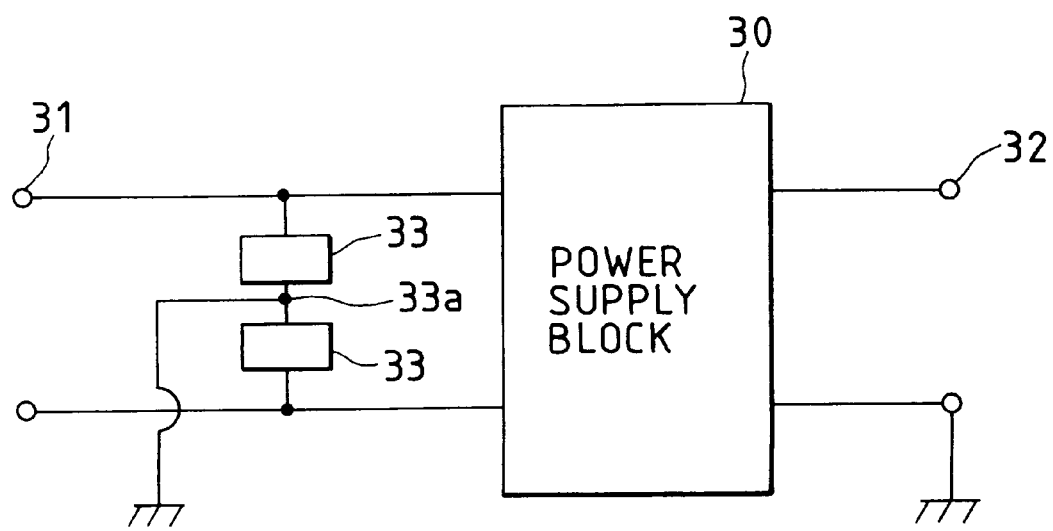
FIG. 7 is a diagram of a power supply circuit as a constituent common to electronic devices of the prior art and of the present invention.
Figure 8:
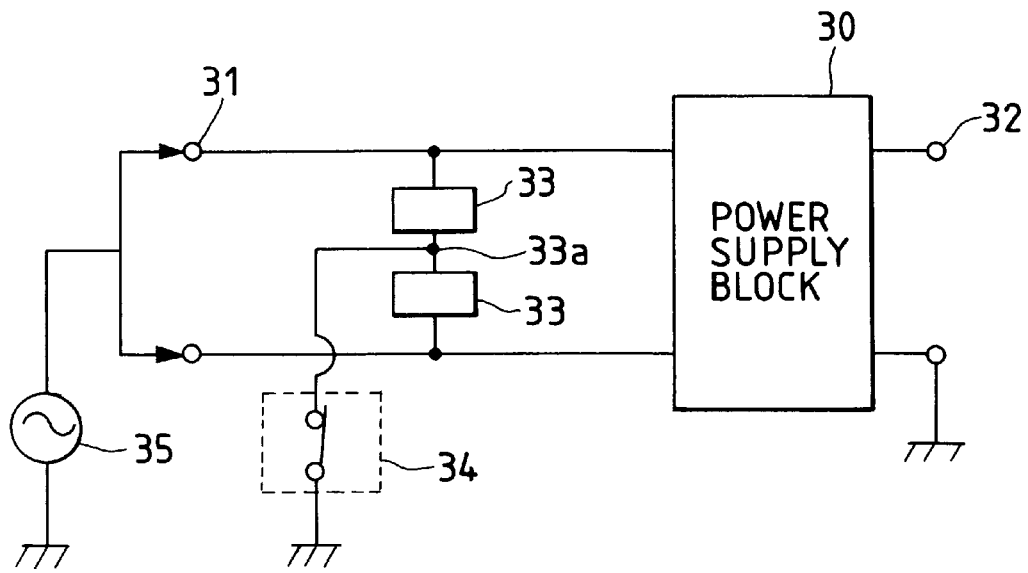
FIG. 8 is a diagram explanatory of a high withstand voltage test for the power supply circuit.
Figure 9:
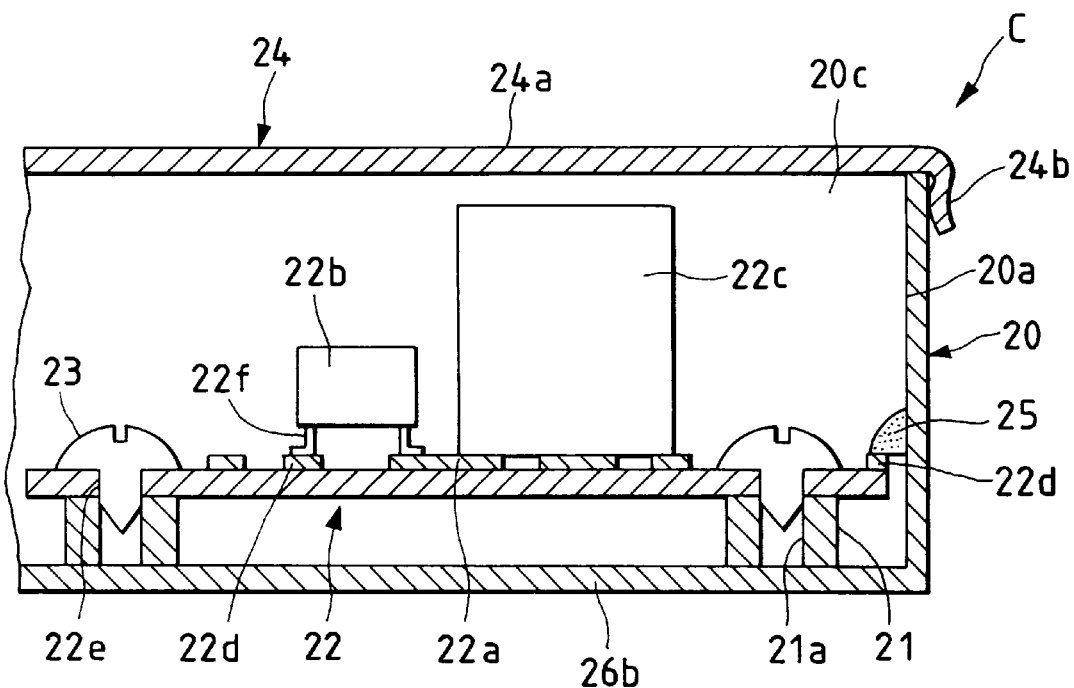
FIG. 9 is a sectional view of a principal portion of a conventional electronic device.

As to the power supply circuit diagram of FIG. 7 and the explanatory diagram of the power supply circuit in a high withstand voltage test of FIG. 8, both associated with the electronic devices embodying the invention, their constructions and operations are as described above, so explanations thereof will here be omitted.

Figure 1:
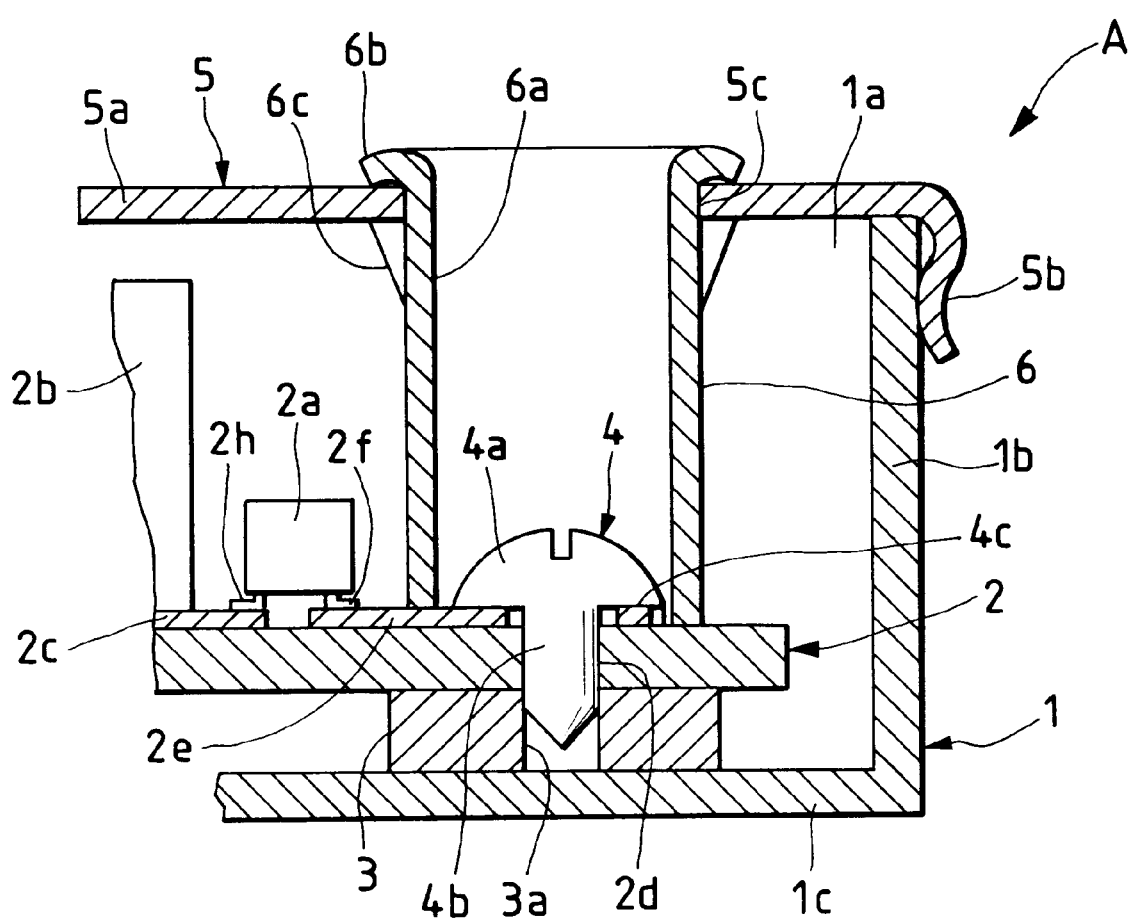
FIG. 1 is a sectional view of a principal portion of an electronic device according to an embodiment of the present invention.

An electronic device according to an embodiment of the present invention will be described below with reference to FIGS. 1 to 3.

A chassis 1 of the electronic device, indicated at A, is formed of a metallic material and is in the shape of a box comprising an opening portion 1a located on the upper surface side, side walls 1b located on the four sides and a bottom wall 1c on the bottom side. The chassis 1 also serves as a housing.

A printed circuit board 2 is made of a resin material and has holes 2d formed in a plurality of predetermined positions, for example, in the four corners of the board. On the upper surface of the board 2 are formed predetermined circuit patterns 2c, including an earth pattern 2e. Electric components which constitute a power supply block 30 (see FIG. 7) such as a power transformer 2b, as well as a diode and an electrolytic capacitor (neither shown), are attached to the circuit patterns 2c. Also connected to the circuit patterns is a protective element 2a such as an arrester for protecting the power supply block 30 against failure due to a surge voltage. One terminal 2f of the protective element 2a is connected to the earth pattern 2e, while other terminals 2h thereof are connected to the patterns 2c.

The earth pattern 2e connected to one terminal 2f of the protective element 2a is located near one of the plural holes 2d formed in the printed circuit board 2. As shown in FIGS. 1 and 3, the earth pattern 2e is formed with a generally annular land portion 2g so as to surround the hole 2d.

A holding member 3 is formed in a circular or rectangular shape using an electrically conductive material such as metal. Nearly centrally of the holding member 3 is formed a tapped hole 3a.

The holding member 3 is secured to the bottom wall 1c of the chassis 1 at plural positions, using an electrically conductive means such as, for example, soldering or an electrically conductive adhesive.

The screws 4, which are made of a metallic material, are, for example, round head screws or pan head screws and each comprise a bolt head 4a and a threaded portion 4b.

For mounting the printed circuit board 2 to the holding members 3 in the interior of the chassis 1, the holes 2d of the board 2 are positioned opposedly to the tapped holes 3a of the holding members, then the threaded portions 4b of the screws 4 are inserted respectively into the holes 2d and further threaded into the tapped holes 3a of the holding members 3.

At this time, a bearing surface 4c (see FIG. 1) of the bolt head 4a of one screw 4 is in abutment against the annular land portion 2g, whereby the land portion 2g is held in an electrically conductive state with respect to the chassis 1 through the screw 4 and the holding member 3. It follows that one terminal 2f of the protective element 2a is earthed to the chassis 1.

When one screw 4 is loosened, the screw 4 and the land portion 2g are not in contact with each other, and the terminal 2f of the protective element 2a is not connected to the chassis 1. That is, the switch element 34 shown in FIG. 8 is formed between the earth pattern 2e and the holding member 3, and the screw 4 serves as a movable contact of the switch element.

The upper cover 5 comprises a rectangular upper wall 5a, a plurality of resilient mounting portions 5b bent from end portions of four sides of the upper wall 5a and extending downward, and circular holes 5c formed in the upper wall 5a at positions above and opposed to the positions where the screws 4 are disposed.

In a mounted state of the upper cover 5, the upper wall 5a covers the opening portion 1a of the chassis 1 and the mounting portions 5b grip the side walls 1b of the chassis.

A sleeve 6, which is formed of an insulating molding material, and comprises a body portion 6a, a flange portion 6b formed on the upper end side, and a snap portion 6c formed under the flange portion 6b. The body portion 6a has a cylindrical bore formed in such a manner that the diameter on the upper end side is larger than the diameter on the lower end side.

When the sleeve 6 is fitted in the hole 5c of the upper cover 5, its snap portion 6c is locked to the hole 5c and the lower end side of the bore of the body portion 6a surrounds the bolt head 4a of the screw 4.

Figure 2:
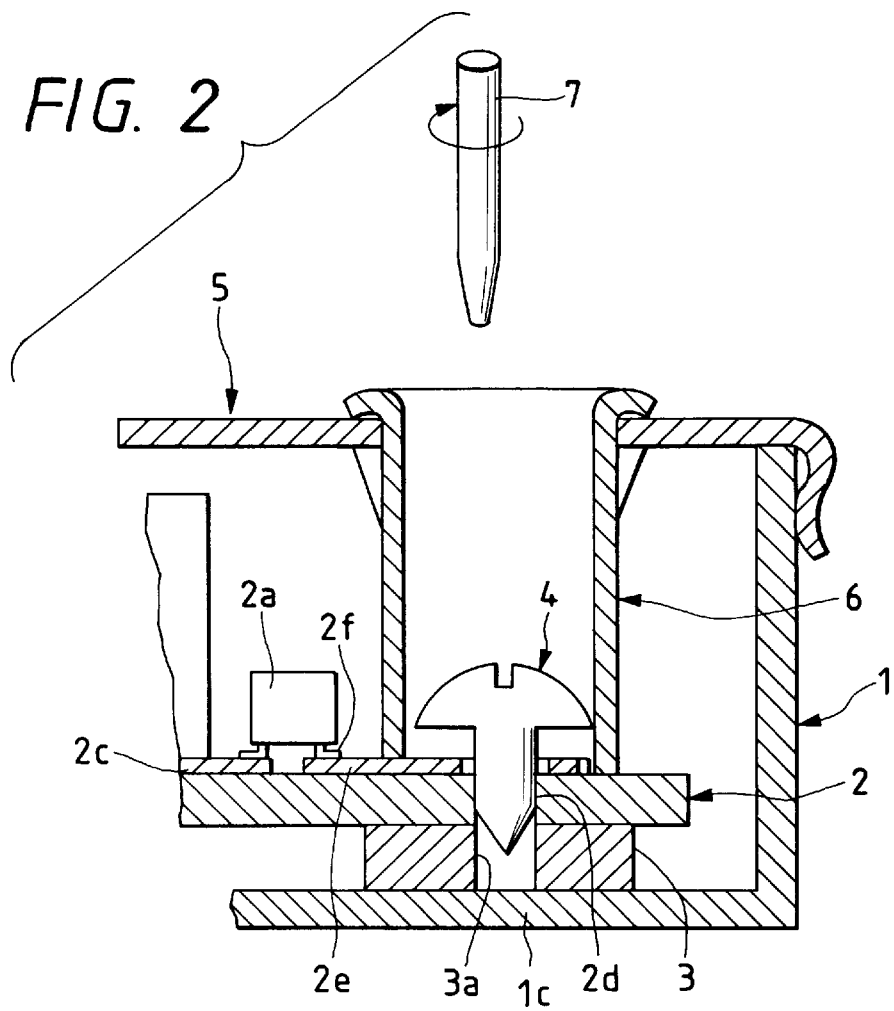
FIG. 2 is a sectional view of the principal portion explaining a high withstand voltage test for the electronic device.
Figure 3:
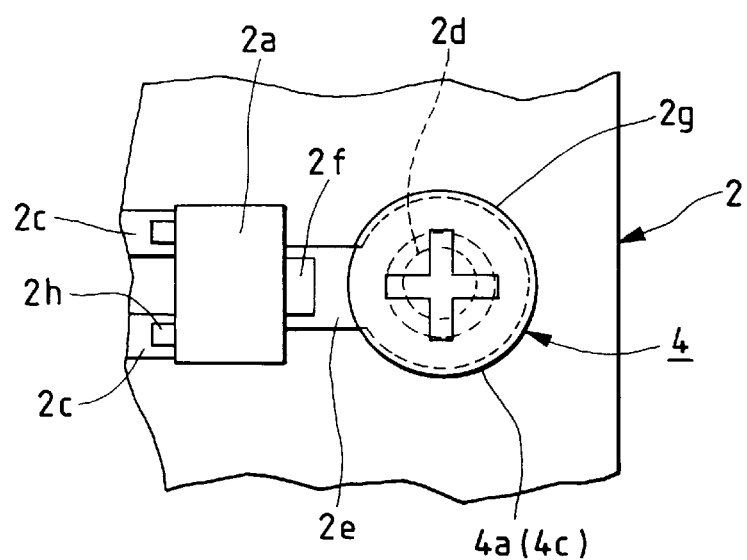
FIG. 3 is a partial plan view showing a printed circuit board used in the electronic device.

As shown in FIG. 2, the bearing surface 4c of the screw 4 can be brought into contact with and away from the land portion 2g by inserting a screw-driver 7 into the sleeve 6 from above the upper cover 5 of the chassis 1 as a housing and then turning the screw-driver to move the screw 4. As the screw 4 is tightened, one terminal 2f (earth terminal) of the protective element 2a is earthed to the chassis 1 through the screw 4, while as the screw 4 is loosened, its bearing surface 4c moves out of contact with the land portion 2g, so that the terminal 2f is no longer earthed to the chassis.

Thus, a switch element is constituted by both bearing surface 4c of the screw 4 and land portion 2g of the earth pattern 2e. The holes 5c formed in the upper cover 5 each permit the screw-driver 7 to be inserted therein from the exterior and permits the screw 4 to be rotated with the screw-driver. The sleeve 6 serves to guide the screw-driver 7 and prevent the entry of dust or the like into the electronic device. Thus, the on-off operation of the aforesaid switch element can be done without removing the upper cover 5 from the chassis 1.

Further, since the holes 5c of the upper cover 5 are each protected by the sleeve 6, even in the event dust should fall into the hole 5c, there is no fear of stain or short-circuit of the circuit patterns formed on the printed circuit board 2.

The following description is now provided about the procedure of a high withstand voltage test for the electronic device A of the above construction against a surge voltage.

First, the printed circuit board 2 with the protective element 2a, etc. rested and connected thereon is inserted in the interior of the chassis 1 and is mounted to the chassis with plural screws 4 exclusive of one screw 4, which one screw 4 is loosely threaded into the associated holding member 3, allowing the earth pattern 2e and the holding member 3 to be kept out of connection with each other. Next, the upper cover 5 is applied to the opening portion 1a of the chassis 1, and the snap portions 6c of the sleeves 6 are respectively brought into engagement with the holes 5c of the upper cover to afford a nearly completed product.

In this state, a high voltage (for example an AC voltage of 2400V) is applied one to two seconds to the input terminal 31 shown in FIG. 8 of the power supply circuit of the electronic device A.

In the electronic device A having gone through the high withstand voltage test, with the screw bearing surface 4c not in contact with the land portion 2g of the earth pattern 2e, the screw-driver 7 is inserted into the sleeve 6 from the exterior of the upper cover 5, and one screw 4 held by the associated holding member 3 is tightened with the screw-driver 7, allowing the bearing surface 4c of the screw to come into contact with the land port in 2g of the earth pattern 2e, whereby the earth-side terminal 2f of the protective element 2a is earthed to the chassis 1 through both screw 4 and holding member 3.

Figure 4:
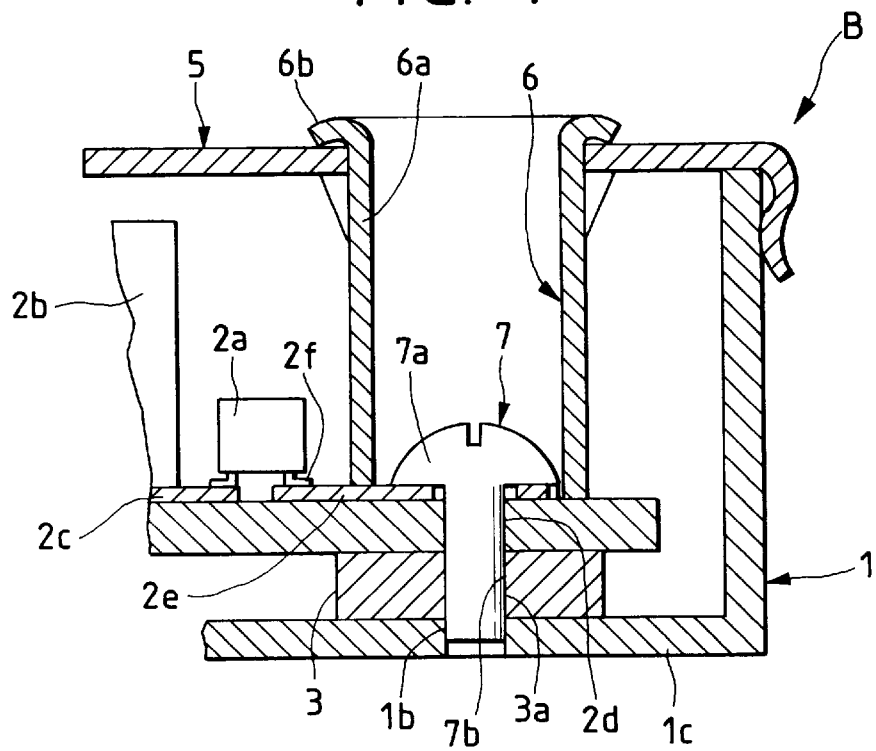
FIG. 4 is a sectional view of a principal portion of an electronic device according to a second embodiment of the present invention.

Referring now to FIG. 4, there is illustrated an electronic device B according to the second embodiment of the present invention. A screw 7 used in the electronic device B is formed of a metallic material and a bolt head 7a thereof is abutted against the earth pattern 2e. The tip of a screw thread 7b is directly threaded into a hole 1d formed in the chassis 1 to fix the printed circuit board 2 to the chassis through the holding member 3.

As a result, the earth-side terminal 2f of the protective element 2a is electrically connected to the chassis 1 through both earth pattern 2e and screw 7.

Other constructional points are the same as in the previous embodiment. As to the same components as in the previous embodiment, they are identified by like reference numerals and explanations thereof are here omitted.

Figure 5:
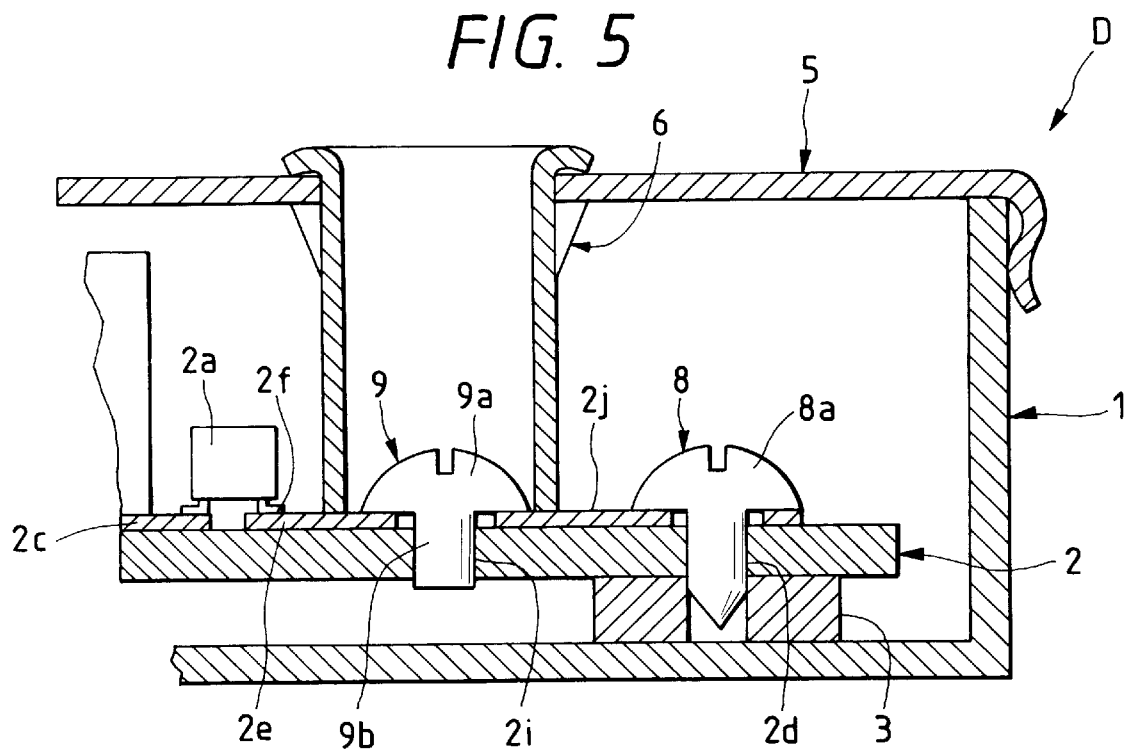
FIG. 5 is a sectional view of a principal portion of an electronic device according to a third embodiment of the present invention.
Figure 6:
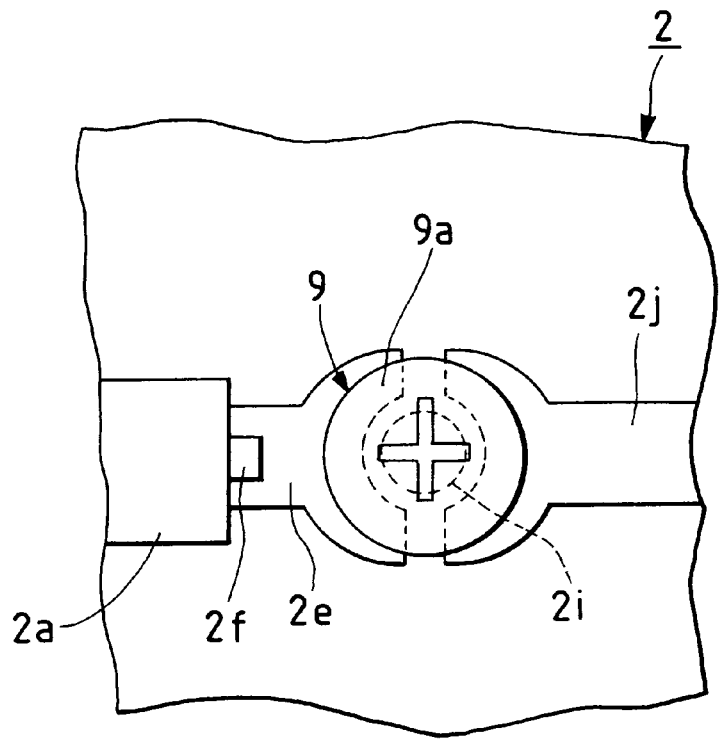
FIG. 6 is a partial plan view showing a printed circuit board used in the electronic device of the third embodiment.

Referring now to FIGS. 5 and 6, there is illustrated an electronic device D according to the third embodiment of the present invention.

A printed circuit board 2 used in this electronic device D has holes formed in a plurality of predetermined positions, for example, in the four corners. A tapped hole 2i is formed near one of the holes 2d, and predetermined circuit patterns 2c, including an earth pattern 2e and a lead-out pattern 2j, are formed on the upper surface of the printed circuit board 2.

One end portion of the earth pattern 2e and one end portion of the lead-out pattern 2j are opposed to and spaced from each other so as to surround the tapped hole 2i each in a semicircular form. At the opposite end portion of the lead-out pattern 2j is formed a generally annular land portion 2g so as to surround the one hole 2d.

A screw 8 as a first screw is formed of a metallic material and a bolt head 8a thereof is threaded into and kept in abutment with the land portion 2g of the lead-out pattern 2j which is apart of the circuit patterns 2c formed on the printed circuit board 2. With such screws 8, the printed circuit board 2 is held by the holding members 3 and is secured to the chassis 1, and the lead-out pattern 2j is electrically connected to the chassis at all times.

A screw 9 as a second screw is formed of a metallic material and comprises a bolt head 9a and a threaded portion 9b. The threaded portion 9b of the screw 9 is threaded into the tapped hole 2i formed in the printed circuit board 2. The bolt head 9a is in abutment with the earth pattern 2e and the lead-out pattern 2j so as to straddle both patterns. Further, the bolt head 9a is surrounded with a sleeve 6. The lead-out pattern 2j is connected to the earth pattern 2e through the bolt head 9a abutted with both patterns.

When the screw 9 is loosened, it is not in contact with the earth pattern 2e and the lead-out pattern 2j, and the terminal 2f of the protective element 2a is not connected to the chassis 1. That is, the switch element 34 shown in FIG. 8 is formed between the earth pattern 2e and the lead-out pattern 2j, and the screw 9 functions as a movable contact of the switch element.

Other constructional points of the electronic device D are almost the same as those of the electronic device A, so the same components as in the electronic device A are identified by like reference numerals and detailed explanations thereof will be omitted here.

The means for mounting the printed circuit board 2 to the chassis 1 is not limited to the screw 8. Any other suitable means may be adopted if only an electrical conduction is ensured, such as caulking or soldering.

In each of the above embodiments, the sleeve 6 may be omitted.

Although in each of the above embodiments the chassis 1 also serves as a housing, the housing may be formed using a separate member from the chassis 1 and the chassis may be enclosed in the housing thus formed.

In the electronic device of the present invention, as set forth above, in conducting a high withstand voltage test against a surge voltage, the earthing and non-earthing (on-off) of the protective element such as an arrester for protecting the electronic device from the surge voltage are effected respectively by tightening and loosening of a screw which is for earthing a printed circuit board to the chassis. The screw can be tightened and loosened easily with a screw-driver and therefore the protective element can be earthed in an extremely easy manner after the high withstand voltage test.

Moreover, since holes are formed in the upper cover at positions opposed to the screws, a screw-driver can be inserted into each of the holes to tighten the associated screw. In tightening the screw, therefore, it is not necessary to remove the upper cover, and the tightening of the screw can be done easily.

Since a cylindrical sleeve is fitted in each hole of the upper cover as guiding and protecting means, there is no fear of stain or short-circuit of circuit patterns by dust or the like falling into the hole, nor is there any fear that man may put his or her finger into the hole and receive an electric shock upon contact with a current flowing portion in the chassis.

Moreover, when the screw-driver is inserted into the aforesaid hole from the exterior of the same hole to tighten the screw, the sleeve plays the role of a guide for the screw-driver and hence the screw tightening work can be done more efficiently.

Since the sleeve is constructed so that it can be snapped into each hole of the upper cover, the mounting of the sleeve into the hole can be done in an extremely easy manner.

In the embodiment wherein screws are directly threaded into the chassis, the screws and the chassis can be easily rendered conductive with each other. Consequently, it is no longer required that the holding members for holding the printed circuit board be formed using an electrically conductive material. As a result, the freedom of design is enhanced.

Further, in the embodiment including means for mounting the printed circuit board to the chassis and a screw for connecting and disconnecting the earth pattern and the lead-out pattern, the earth pattern is earthed to the chassis through the mounting means, lead-out pattern and screw, so that the screw for connecting and disconnecting the earth pattern and the lead-out pattern can be provided separately from the mounting means. Consequently, the freedom of the screw mounting position is enhanced and it becomes easier to make design.

What is claimed is:

1. An electronic device comprising:

a metallic chassis;

a printed circuit board mounted on said chassis;

circuit patterns and a lead-out pattern which are formed on said printed circuit board;

a protective element for attenuating a surge voltage, said protective element being connected to said circuit patterns;

holding screws for holding said printed circuit board on said chassis; and a connecting/disconnecting screw for connection and disconnection between said circuit patterns and said lead-out pattern, said circuit patterns and said lead-out pattern being connected together electrically through said connecting/disconnecting screw, and said lead-out pattern and said chassis being connected together electrically through any of said holding screws.

2. An electronic device according to claim 1, wherein said chassis has an opening portion, which is covered with an upper cover, with holes being formed in said upper cover at positions opposed to said screws, and cylindrical sleeves are respectively fitted in said holes so as to surround said screws.

3. An electronic device according to claim 2, wherein said sleeves are adapted to be snapped in the holes of said upper cover.

* * * * *